(12) United States Patent
Tekleab

(10) Patent No.: US 9,812,489 B2
(45) Date of Patent: Nov. 7, 2017

(54) PIXELS WITH PHOTODIODES FORMED FROM EPITAXIAL SILICON

(71) Applicant: SEMICONDUCTOR COMPONENTS INDUSTRIES, LLC, Phoenix, AZ (US)

(72) Inventor: Daniel Tekleab, Hayward, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/133,129

(22) Filed: Apr. 19, 2016

(65) Prior Publication Data

US 2017/0133426 A1 May 11, 2017

Related U.S. Application Data

(60) Provisional application No. 62/252,775, filed on Nov. 9, 2015.

(51) Int. Cl.
*H01L 27/146* (2006.01)
*H04N 5/225* (2006.01)
(Continued)

(52) U.S. Cl.
CPC .. *H01L 27/14645* (2013.01); *H01L 21/28035* (2013.01); *H01L 27/1463* (2013.01); *H01L 27/14614* (2013.01); *H01L 27/14621* (2013.01); *H01L 27/14627* (2013.01); *H01L 27/14636* (2013.01); *H01L 27/14689* (2013.01);
(Continued)

(58) Field of Classification Search
CPC .......... H01L 27/1464; H01L 27/14621; H01L 27/14623; H01L 27/14627; H01L 27/1463; H01L 27/14643; H01L 27/1468
See application file for complete search history.

(56) References Cited

U.S. PATENT DOCUMENTS

2006/0157815 A1* 7/2006 Chang ................. H01L 27/0629
257/500
2007/0246745 A1* 10/2007 Min .................... H01L 27/1463
257/225

(Continued)

OTHER PUBLICATIONS

Tekleab, U.S. Appl. No. 14/543,793, filed Nov. 17, 2014.

*Primary Examiner* — Allen Parker
*Assistant Examiner* — Ismail Muse
(74) *Attorney, Agent, or Firm* — Treyz Law Group, P.C.; Joseph F. Guihan

(57) ABSTRACT

An image sensor may include a plurality of pixels that each contain a photodiode. The pixels may include deep photodiodes for near infrared applications. The photodiodes may be formed by growing doped epitaxial silicon in trenches formed in a substrate. The doped epitaxial silicon may be doped with phosphorus or arsenic. The pixel may include additional n-wells formed by implanting ions in the substrate. Isolation regions formed by implanting boron ions may isolate the n-wells and doped epitaxial silicon. The doped epitaxial silicon may be formed at temperatures between 500° C. and 550° C. After forming the doped epitaxial silicon, laser annealing may be used to activate the ions. Chemical mechanical planarization may also be performed to ensure that the doped epitaxial silicon has a flat and planar surface for subsequent processing.

14 Claims, 14 Drawing Sheets

(51) Int. Cl.
    *H01L 31/103*     (2006.01)
    *H01L 21/66*     (2006.01)
    *H01L 21/28*     (2006.01)
    *H01L 29/49*     (2006.01)
    *H01L 31/18*     (2006.01)

(52) U.S. Cl.
    CPC .... *H01L 27/14698* (2013.01); *H01L 29/4916* (2013.01); *H01L 31/1804* (2013.01); *H01L 31/1864* (2013.01)

(56) References Cited

U.S. PATENT DOCUMENTS

| | | | |
|---|---|---|---|
| 2010/0133441 A1* | 6/2010 | Aurola | H01L 27/14679 250/370.14 |
| 2012/0028401 A1* | 2/2012 | De Munck | H01L 27/1463 438/73 |
| 2013/0009039 A1* | 1/2013 | Sato | H01L 27/14623 250/208.1 |
| 2013/0082342 A1* | 4/2013 | Lu | H01L 27/14621 257/432 |
| 2014/0232918 A1* | 8/2014 | Shinohara | H01L 27/14623 348/308 |
| 2015/0102455 A1* | 4/2015 | Zhang | H01L 27/2409 257/510 |
| 2015/0221686 A1* | 8/2015 | Wei | H01L 27/14806 257/292 |

* cited by examiner

PIXELS WITH PHOTODIODES FORMED FROM EPITAXIAL SILICON

CROSS-REFERENCE TO RELATED APPLICATION(S)

This application claims priority to U.S. Provisional Application No. 62/252,775, filed on Nov. 9, 2015, entitled "Pixels with Photodiodes Formed from Epitaxial Silicon," invented by Daniel Tekleab, and is incorporated herein by reference and priority thereto for common subject matter is hereby claimed.

BACKGROUND

The present invention relates to image sensors and, more particularly, to forming photodiodes for image sensors.

Digital cameras are often provided with digital image sensors such as CMOS image sensors. Digital cameras may be stand-alone devices or may be included in electronic devices such as cellular telephones or computers. A typical CMOS image sensor has an image sensor pixel array containing thousands or millions of pixels. Each pixel typically includes a photosensor such as a photodiode that receives incident photons (light) and converts the photons into electrical signals.

In certain circumstances, image sensors may be used to capture near infrared light. Near infrared light may penetrate deep into a photodiode before being converted into electrical signals. Therefore, in order to ensure accurate sensing of near infrared light, a deep photodiode is required. Typically, photodiodes are formed by implanting n-type or p-type ions in a silicon substrate. However, a large amount of energy is required to implant ions deep enough for near infrared applications. These high energy implants may cause significant damage to the silicon substrate, resulting in high level of hot pixel and dark current. This may adversely affect the performance of the image sensor.

It would therefore be desirable to be able to provide improved methods for forming deep photodiodes in image sensors.

DETAILED DESCRIPTION

Figure 1:
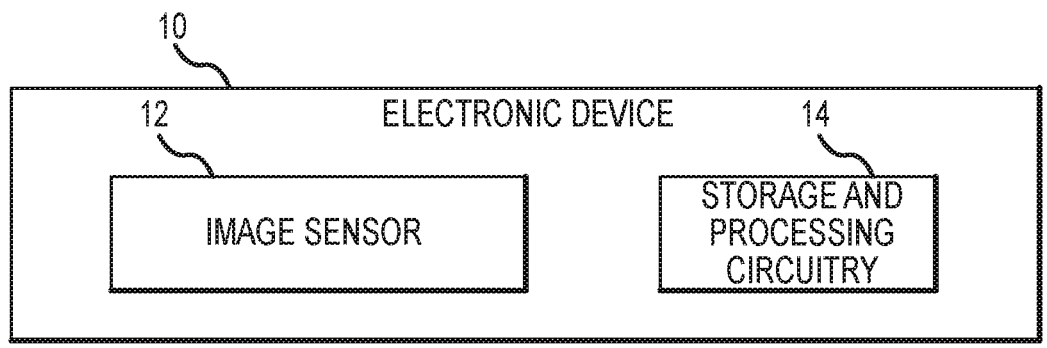
FIG. 1 is a diagram of an illustrative electronic device having an image sensor in accordance with an embodiment of the present invention.

Digital image sensors are widely used in digital cameras and in electronic devices such as cellular telephones, computers, and computer accessories. An illustrative electronic device 10 with an image sensor 12 and storage and processing circuitry 14 is shown in FIG. 1. Electronic device 10 may be a digital camera, a computer, a computer accessory, a cellular telephone, or other electronic device. Image sensor 12 may be part of a camera module that includes a lens or may be provided in an electronic device that has a separate lens. During operation, the lens focuses light onto image sensor 12. The image sensor may be used to detect visible light or other types of light. The image sensor may, for example, detect near infrared light. Image sensor 12 may have an array of image sensor pixels containing photosensitive elements such as photodiodes that convert light into digital data. Image sensors may have any number of pixels (e.g., hundreds, thousands, millions, or more). A typical image sensor may, for example, have millions of pixels (e.g., megapixels).

Image data from image sensor 12 may be provided to storage and processing circuitry 14. Storage and processing circuitry 14 may process the digital image data that has been captured with sensor 12. The processed image data may be maintained in storage in circuitry 14. The processed image data may also be provided to external equipment. Storage and processing circuitry 14 may include storage components such as memory integrated circuits, memory that is part of other integrated circuits such as microprocessors, digital signal processors, or application specific integrated circuits, hard disk storage, solid state disk drive storage, removable media, or other storage circuitry. Processing circuitry in storage and processing circuitry 14 may be based on one or more integrated circuits such as microprocessors, microcontrollers, digital signal processors, application-specific integrated circuits, image processors that are incorporated into camera modules, other hardware-based image processing circuits, combinations of these circuits, etc. If desired, image sensor 12 and processing circuitry 14 may be implemented using a single integrated circuit or may be implemented using separate integrated circuits.

Figure 2:
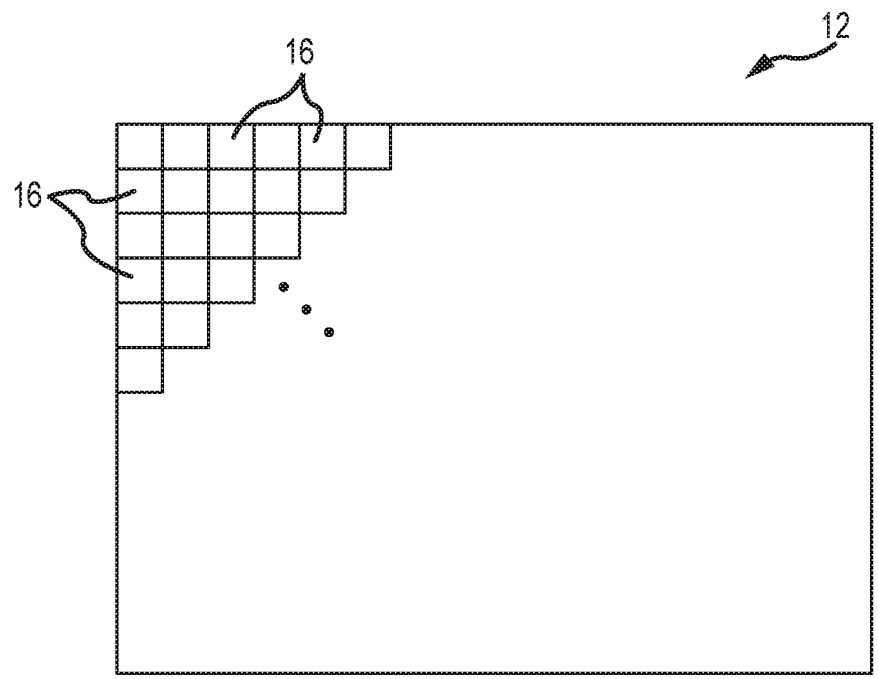
FIG. 2 is a top view of an illustrative image sensor pixel array in accordance with an embodiment of the present invention.

An illustrative image sensor pixel array 12 is shown in FIG. 2. Image sensor 12 of FIG. 2 has an array of image pixels 16. Pixels 16 are typically organized in rows and columns. Each pixel contains a photosensitive element such as a photodiode and corresponding electrical components (e.g., transistors, charge storage elements, and interconnect lines for routing electrical signals).

Figure 3:
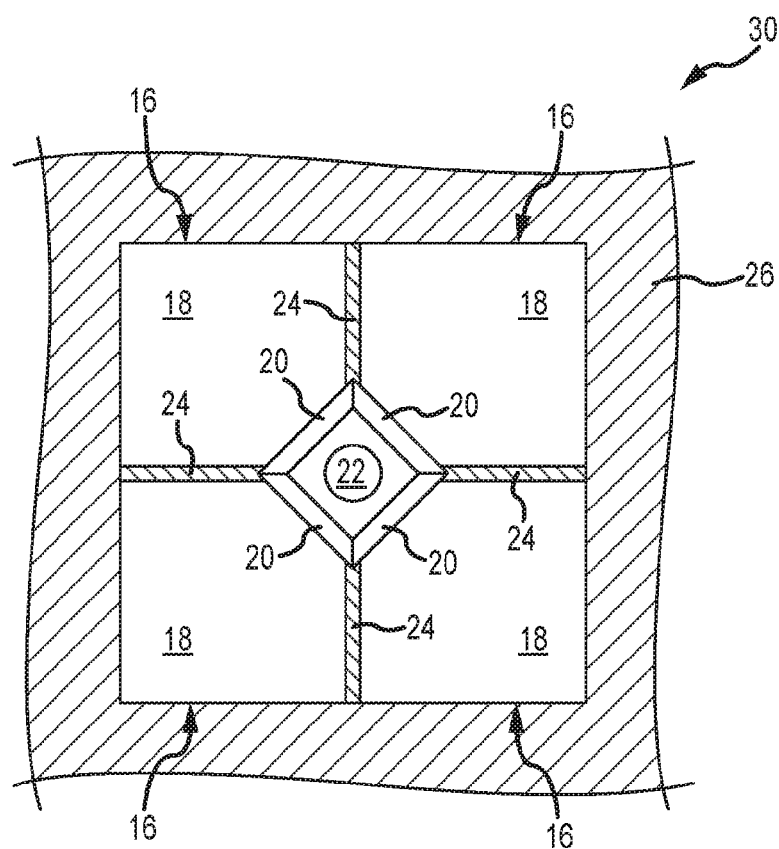
FIG. 3 is a top view of a portion of an illustrative image sensor pixel array in accordance with an embodiment of the present invention.

FIG. 3 is a diagram showing a portion of an array of image sensor pixels 16. In the example of FIG. 3, each pixel 16 has a photodiode 18. Photodiodes 18 may be formed in substrate 30. Photons may strike photodiodes 18 and generate charge. Charge can be transferred to floating diffusion region 22 by turning transfer gates 20 momentarily on. Photodiodes 18 within pixel 16 may be separated by isolation regions 24. Isolation region 26 may separate photodiodes 18 from array transistors and from adjacent pixels.

If desired, each pixel 16 may include a separate floating diffusion node. The example of FIG. 3 in which four pixels 16 share floating diffusion node 22 is merely illustrative.

Substrate 30 may be a silicon substrate or a silicon germanium substrate. Substrate 30 may, for example, be a doped substrate such as a p-type substrate or a p+ substrate. Substrate 30 may have an epitaxial layer such as a p-type or n-type epitaxial layer. Substrate 30 may also be a graded substrate with different levels of doping along the substrate. Isolation regions 24 and 26 may be p-well regions or n-well regions.

Figure 4:
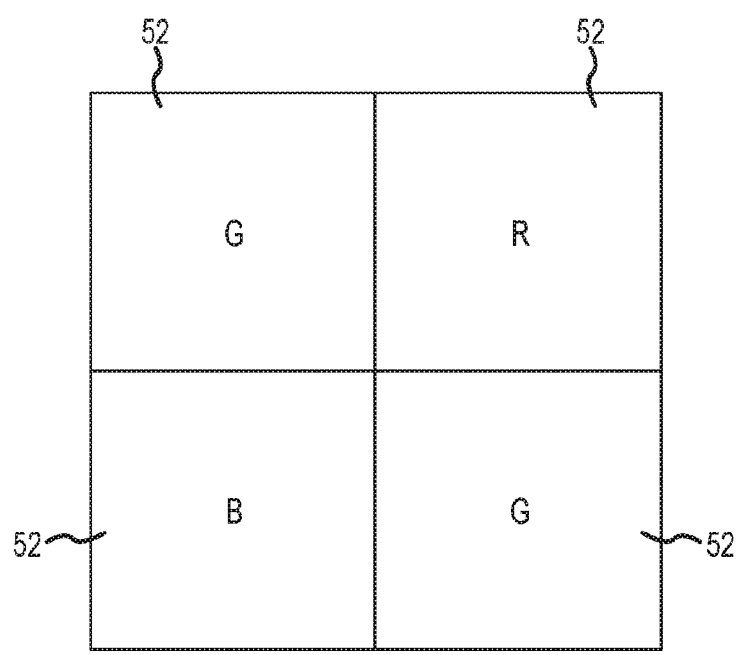
FIG. 4 is a top view of illustrative color filter elements that may be used in an image sensor pixel array in accordance with an embodiment of the present invention.

In certain embodiments, incoming light may pass through a color filter before striking one of photodiodes 18 of FIG. 3. FIG. 4 is a top view of illustrative color filter elements that may filter light for pixels 16 of FIG. 3. The color filter pattern of FIG. 4 has red (R), green (G), and blue (B) color filter elements 52 and is sometimes referred to as a Bayer pattern. The pattern of FIG. 4 is merely illustrative, however. If desired, other patterns and/or other filter elements (e.g., filter elements having different spectral responses) may be used. For example, a filter that passes infrared light or near infrared light may be used. Each filter element may have a respective microlens used to focus light on the underlying photosensitive area.

Figure 5:
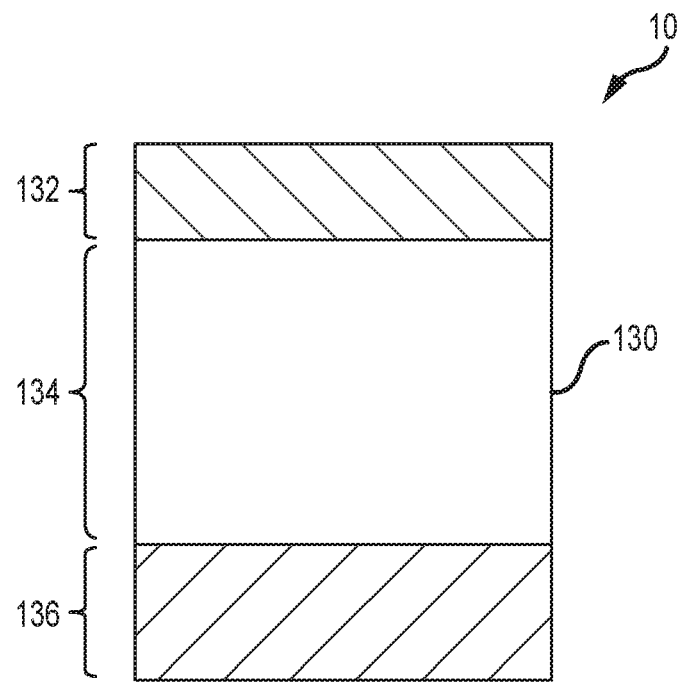
FIG. 5 is a cross-sectional side view of an illustrative graded substrate in accordance with an embodiment of the present invention.

In certain embodiments, it may be desirable for image sensor 12 to be able to detect near infrared light (NIR). Efficiently detecting near infrared light may necessitate a deep photodiode. To form a deep photodiode that may be used in near infrared light applications, a substrate may be provided such as substrate 130 at step 102 as shown in FIG. 5. Substrate 130 may be a silicon substrate or a silicon germanium substrate. Substrate 130 may, for example, be a doped substrate such as a p-type substrate or an n-type substrate. Substrate 130 may be a layer of epitaxial silicon such as a p-type or n-type epitaxial layer. Substrate 130 may sometimes be referred to as a wafer.

In certain embodiments, substrate 130 may be a graded substrate provided with different doping concentrations. For example, region 132 may have a first doping concentration, region 134 may have a second doping concentration, and region 136 may have a third doping concentration. Region 132 may be lightly doped, region 134 may have a higher doping concentration than region 132, and region 136 may have a higher doping concentration than region 132 and 134. Regions 132, 134 and 136 may be doped with boron. Region 134 may have a concentration of boron between $10^{16}$ cm$^{-3}$ and $10^{17}$ cm$^{-3}$. In certain embodiments, region 134 may have a concentration of boron of $5\times10^{16}$ cm$^{-3}$. Region 136 may have a concentration of boron between $10^{18}$ cm$^{-3}$ and $10^{19}$ cm$^{-3}$. In certain embodiments, region 136 may have a concentration of boron of $3\times10^{18}$ cm$^{-3}$. These concentrations are merely illustrative and any desired doping concentrations may be used. The example of boron being used as a dopant is also illustrative, and any other desired dopant may be used. Regions 132, 134, and 136 may have any desired thicknesses. In certain embodiments, region 132 may have a thickness of about 0.5 μm, region 134 may have a thickness of about 5.0 μm, and region 136 may have a thickness of about 1.0 μm. Other thicknesses may be used if desired.

Figure 6:
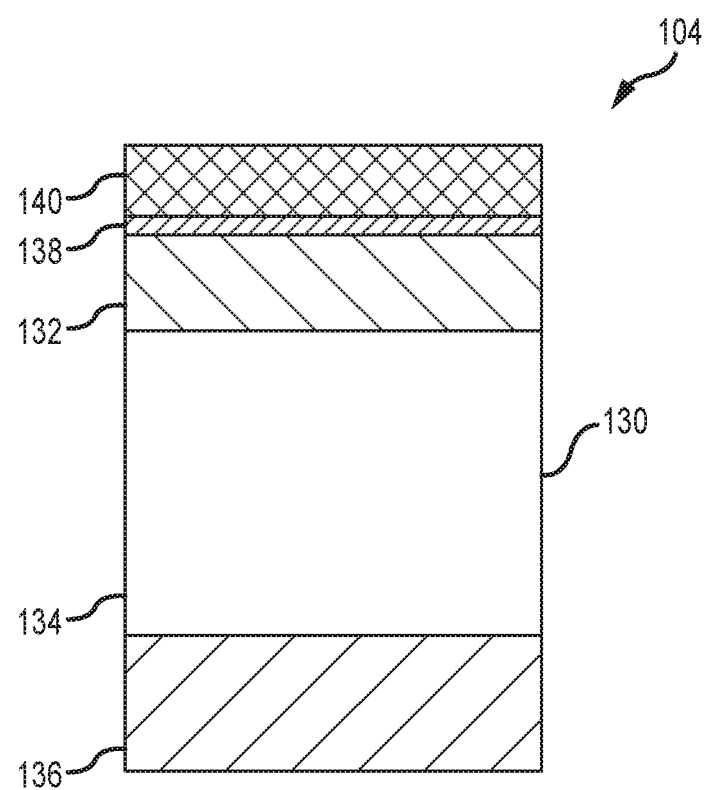
FIG. 6 is a cross-sectional side view of the graded substrate of FIG. 5 with gate oxide and gate polysilicon in accordance with an embodiment of the present invention.

At step 104 of FIG. 6, substrate 130 may be provided with gate oxide 138 and gate polysilicon 140. Gate oxide 138 and gate polysilicon 140 may be formed on substrate 130 using any desired methods.

Figure 7:
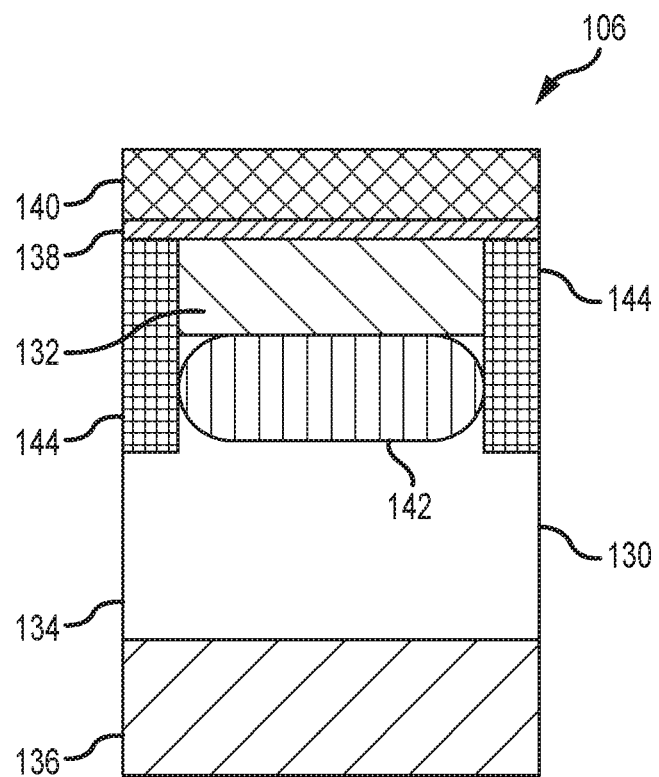
FIG. 7 is a cross-sectional side view of the pixel of FIG. 6 with an n-well and isolation regions in accordance with an embodiment of the present invention.

At step 106 of FIG. 7, substrate 130 may be provided with an n-well implant as well as p-well isolation. N-well 142 may be formed by implanting n-type dopant into substrate 130. N-well 142 may be formed with phosphorus or arsenic dopants, as examples. Isolation regions 144 may be formed by implanting p-type dopant into substrate 130. Isolation regions 144 may be formed with boron as a dopant, as an example. N-well 142 may be interposed between isolation regions 144 to separate n-well 142 from certain array transistors and from adjacent pixels. Isolation regions 144 may partially surround n-well 142 or completely surround n-well 142 (e.g., isolation regions 144 may surround n-well two, four, less than four, more than four, or all sides of n-well 142). The isolation regions prevent charge from leaking into the n-wells of adjacent pixels. This occurrence, known as crosstalk, may result in artifacts in the image produced by the image sensor.

Figure 8:
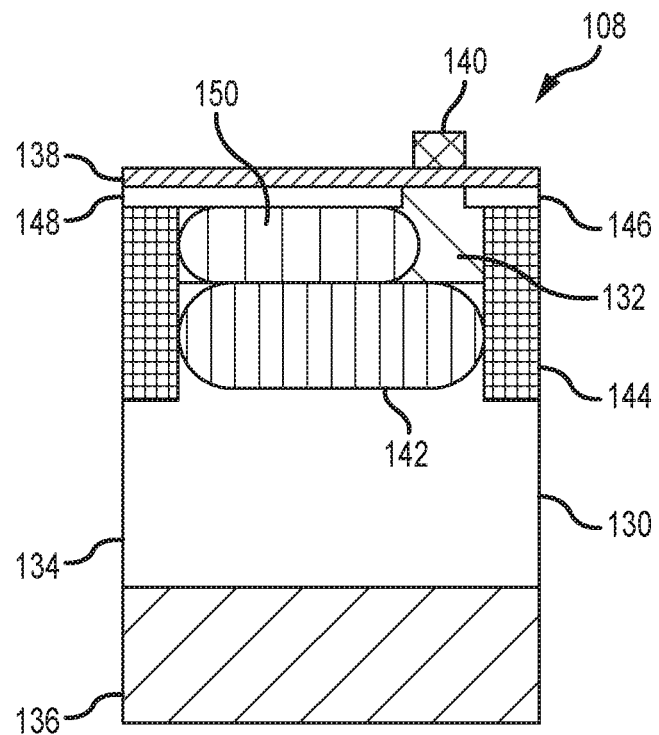
FIG. 8 is a cross-sectional side view of the pixel of FIG. 7 after the gate polysilicon has been patterned and an additional n-well has been implanted in accordance with an embodiment of the present invention.

At step 108 of FIG. 8, gate polysilicon 140 may be patterned using any desired methods. Gate polysilicon 140 may be used as a transfer gate in the pixel. An additional region 146 may be formed. Region 146 may be a charge storage region such as a floating diffusion region. Floating diffusion region 146 may be an n-well if desired. Gate polysilicon 140 may act as a transfer gate that transfers charge to floating diffusion region 146. At step 108, P+ pinning layer 148 may also be formed. In addition, n-well 150 may be formed. N-well 150 may be formed by implanting phosphorus or arsenic dopants, as examples. In certain embodiments, n-well 150 may be doped with the same dopant as n-well 142. For example, both n-well 150 and n-well 142 may be doped with phosphorus, or both n-well 150 and n-well 142 may be doped with arsenic. In other embodiments, n-well 150 and n-well 142 may be doped with different dopants. For example, n-well 150 may be doped with arsenic while n-well 142 may be doped with phosphorus. Alternatively, n-well 150 may be doped with phosphorus while n-well 142 may be doped with arsenic. In general, each n-well may be doped with any desired dopant. In embodiments where n-well 142 and n-well 150 are formed with the same dopant, a single n-well may be formed in a single implantation if desired. Instead of implanting n-well 142 at step 106 and implanting n-well 150 at step 108, a single n-well may be implanted at either step 106 or step 108.

Figure 9:
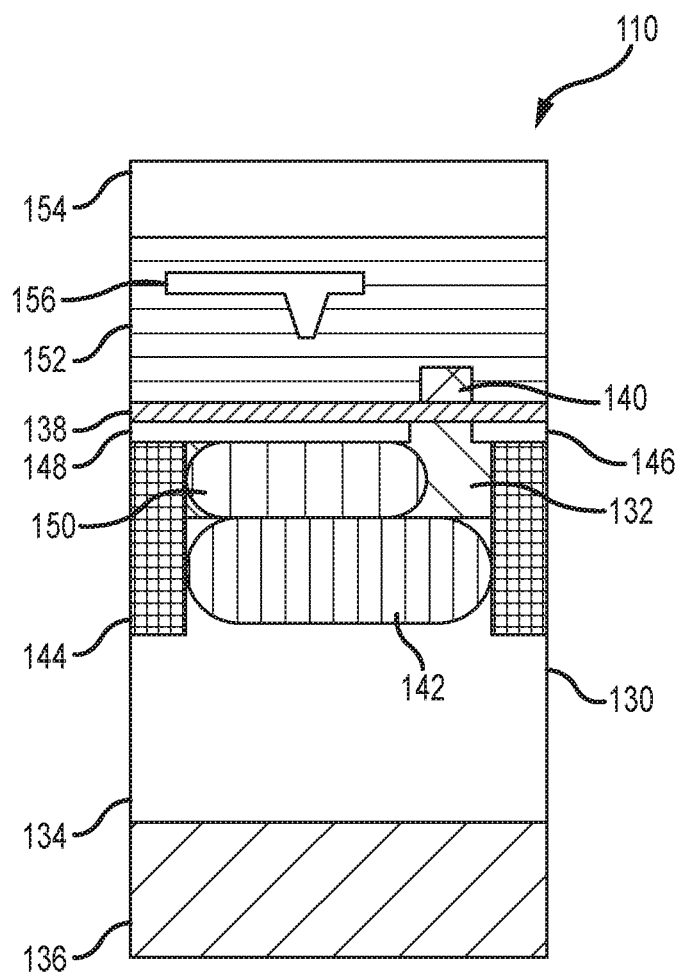
FIG. 9 is a cross-sectional side view of the pixel of FIG. 8 after back end of line processing has occurred and a wafer handler has been attached in accordance with an embodiment of the present invention.

At step 110 of FIG. 9, back end of line (BEOL) processing may occur, resulting in a dielectric stack 152 with metal interconnect routing paths 156 being formed. Additionally at step 110, wafer handler 154 may be attached to the dielectric stack. Wafer handler 154 may be used to move, control, and flip substrate 130 when necessary.

Figure 10:
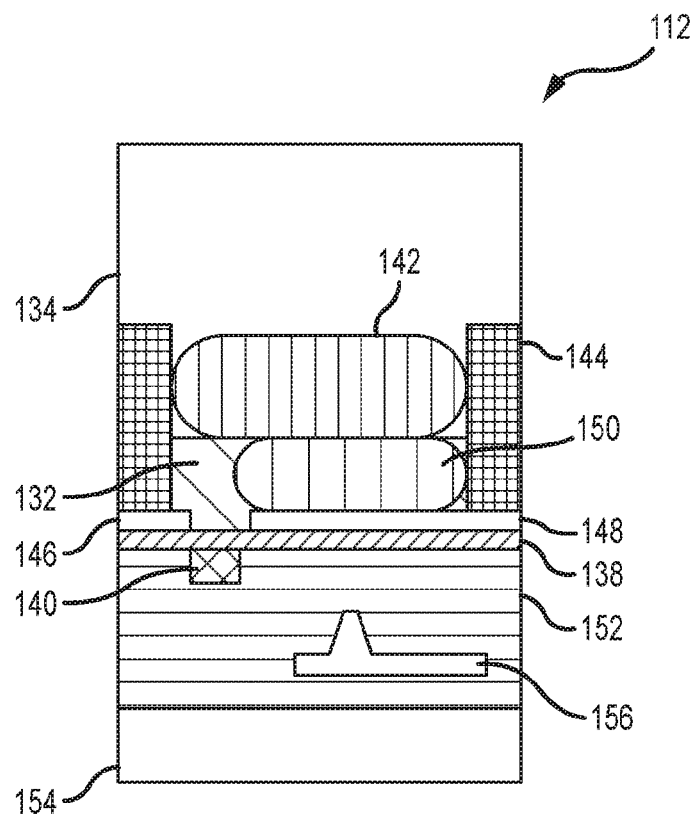
FIG. 10 is a cross-sectional side view of the pixel of FIG. 9 after the wafer has been flipped and the silicon substrate thinned in accordance with an embodiment of the present invention.

At step 112 of FIG. 10, the substrate may be flipped so that wafer handler 154 is underneath the substrate. Substrate 130 may then be thinned to a desired thickness. Substantially all of region 136 may be etched during the thinning process. Region 134 may be etched to a desired thickness. As previously discussed, region 134 and 136 may have different dopant concentrations. The difference in dopant concentrations may serve as an etch stop during the etching process, preventing too much of region 134 from being etched.

The thinning process may be dry etching, wet etching, or another desired thinning process. In wet etching, substrate 130 may be immersed in a bath of etchant. The etchant may be buffered hydrofluoric acid, potassium hydroxide, a solution of ethylene diamine and pyrocatechol, or any other suitable etchant.

Figure 11:
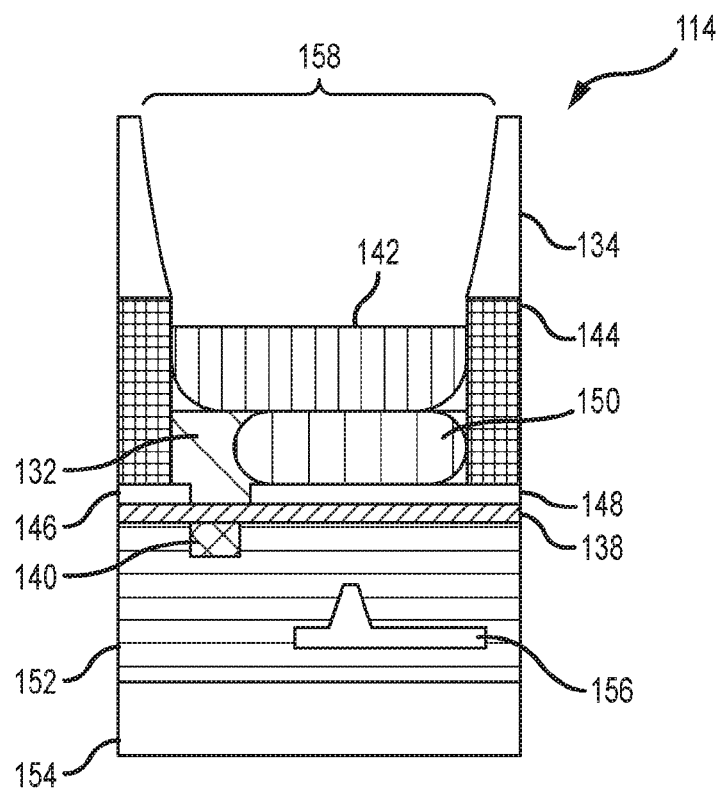
FIG. 11 is a cross-sectional side view of the pixel of FIG. 10 after a trench has been etched in the substrate in accordance with an embodiment of the present invention.

At step 114 of FIG. 11, a trench may be formed. The trench may be formed via an etching process such as dry etching or wet etching. In wet etching, region 134 of substrate 130 may be immersed in a bath of etchant. The etchant may be buffered hydrofluoric acid, potassium hydroxide, a solution of ethylene diamine and pyrocatechol, or any other suitable etchant. A hard mask may be provided that is resistant to the etchant. Accordingly, the hard mask may prevent substrate 130 from being etched in the areas directly beneath the hard mask. In the areas not covered by the hard mask, the silicon etching may form trenches such as trench 158. The dimensions of trench 158 can be controlled during the etching process. For example, immersing substrate 130 in a bath of etchant for a longer period of time may result in a deeper trench.

Figure 12:
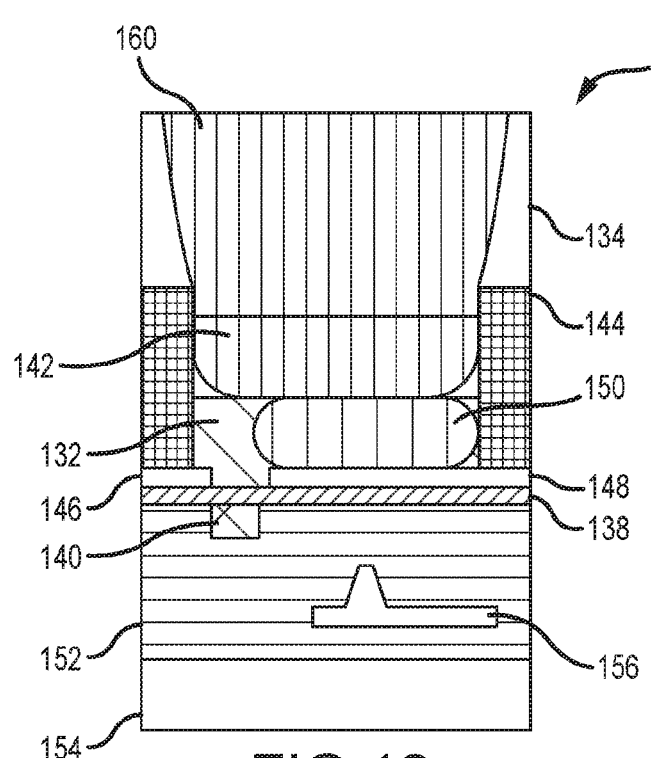
FIG. 12 is a cross-sectional side view of the pixel of FIG. 11 after doped epitaxial silicon has been grown in the trench in accordance with an embodiment of the present invention.

At step 116 of FIG. 12, n-type epitaxial silicon 160 may be grown to fill trench 158. Epitaxial silicon may be doped with the same dopant as n-well 142. For example, both epitaxial silicon 160 and n-well 142 may be doped with phosphorus, or both epitaxial silicon 160 and n-well 142 may be doped with silicon. If desired, doping of epitaxial silicon 160 may be done in situ such that the doping occurs while the epitaxial layer is being grown.

Epitaxial layer 160 may be formed using a variety of growth methods. For example, epitaxial layer 160 may be formed using vapor-phase epitaxy, liquid-phase epitaxy, or solid-phase epitaxy. Epitaxial layer 160 may be formed via growth at any suitable temperature. Epitaxial layer may be formed via growth at temperatures of about 500° C., about 550° C., about 650° C., between 500° C. and 550° C., between 450° C. and 600° C., less than 650° C., more than 650° C., 1200° C., more than 1200° C., or any other suitable temperature. After epitaxial layer 160 is formed, laser annealing may be performed to activate the dopants.

Figure 13:
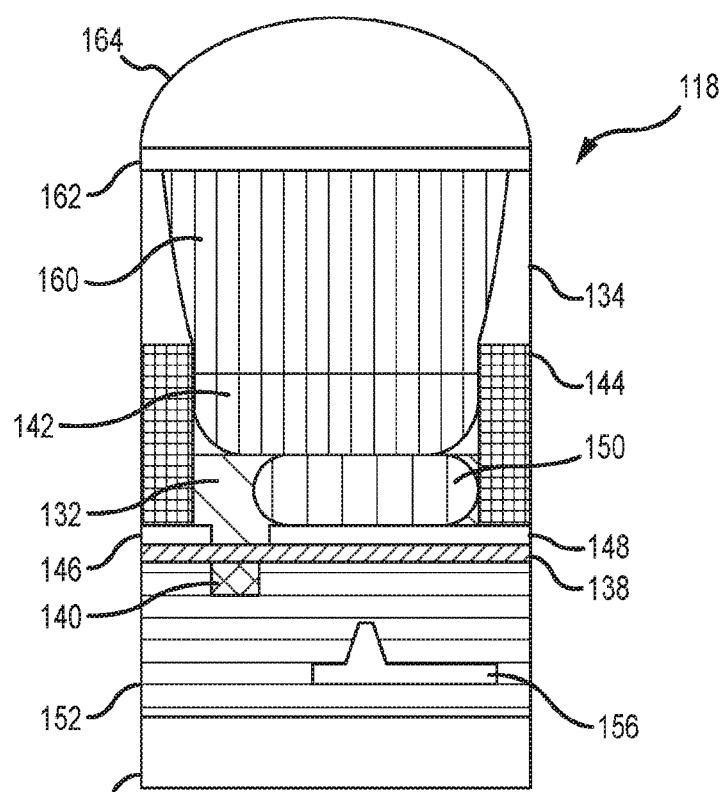
FIG. 13 is a cross-sectional side view of the pixel of FIG. 12 after a color filter element and microlens have been formed in accordance with an embodiment of the present invention.

At step 118 of FIG. 13, filter element 162 and microlens 164 may be formed over epitaxial layer 160. In order to ensure that epitaxial layer 160 is planar before forming filter element 162, epitaxial layer 160 may undergo planarization. Chemical mechanical planarization (CMP) may be performed. Chemical mechanical planarization is a polishing process that produces a flat and smooth surface. After chemical mechanical planarization, filter element 162 and microlens 164 may be formed.

Figure 14:
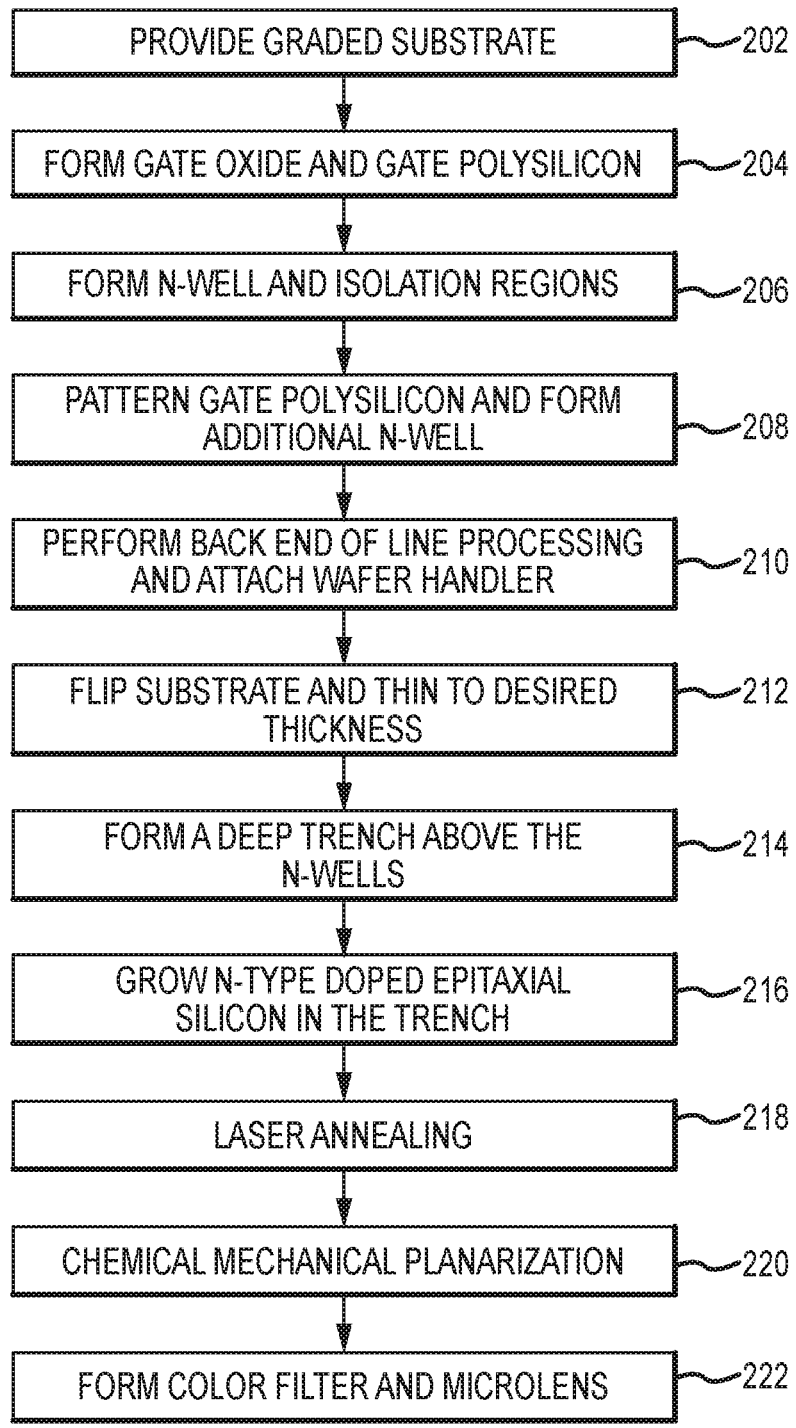
FIG. 14 is a list of illustrative steps showing how doped epitaxial silicon may be grown to form a photodiode for a pixel in accordance with an embodiment of the present invention.

FIG. 14 shows illustrative steps for forming a photodiode using n-type doped epitaxial silicon. At step 202, a substrate may be provided, as shown in FIG. 5. The substrate may be a graded substrate. At step 204, gate oxide and gate polysilicon may be formed on the substrate, as shown in FIG. 6. At step 206, an n-well and isolation regions may be formed using ion implantation, as shown in FIG. 7. The n-well may be formed by implanting phosphorus ions, while the isolation regions may be formed by implanting boron ions. At step 208, the gate polysilicon may be patterned to form, for example, a gate for a transfer transistor. Additionally, a floating diffusion region and p+ pinning layer may be formed, as shown in FIG. 8. Also at step 150, an additional n-well may be formed. However, this step is optional and only one n-well may be formed if desired.

At step 210, the wafer may undergo back end of line processing to form a dielectric stack with metal interconnect routing paths (e.g., FIG. 9). A wafer handler may also be attached to substrate 130 at this time. Next, the substrate may be flipped with the wafer handler at step 212. The substrate may then be thinned to a desired thickness. At step 214, a trench may be formed in the substrate, as shown in FIG. 11. The trench may be formed with an etching process. After forming the trench, n-type doped epitaxial silicon may be grown in the trench at step 216. The n-type doped epitaxial silicon may be doped with the same dopant as one or both of the n-wells. The n-type doped epitaxial silicon and the n-wells may combine to form the photodiode of the pixel. After growing the epitaxial layer, the epitaxial layer may be laser annealed at step 218. After laser annealing, chemical mechanical planarization may be completed at step 220 to ensure the epitaxial layer has a planar and smooth surface. At step 222, a filter element and microlens may be formed over the epitaxial layer.

Figure 15:
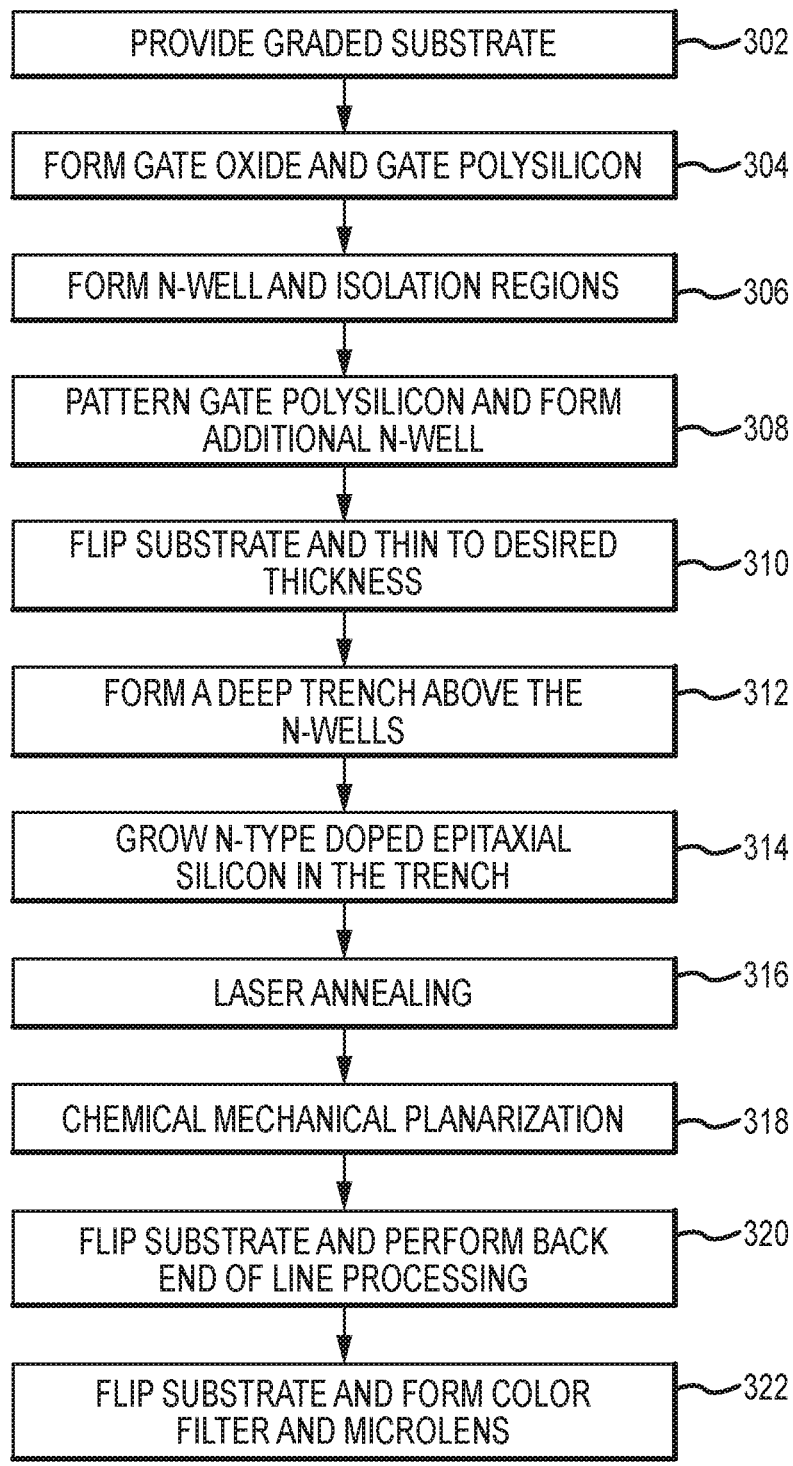
FIG. 15 is a list of illustrative steps showing how doped epitaxial silicon may be grown to form a photodiode for a pixel in accordance with an embodiment of the present invention.

FIG. 15 shows an alternate embodiment for forming a photodiode using n-type doped epitaxial silicon. At step 302, a substrate may be provided, as shown in FIG. 5. The substrate may be a graded substrate. At step 304, gate oxide and gate polysilicon may be formed on the substrate, as shown in FIG. 6. At step 306, an n-well and isolation regions may be formed using ion implantation, as shown in FIG. 7. The n-well may be formed by implanting phosphorus ions, while the isolation regions may be formed by implanting boron ions. At step 308, the gate polysilicon may be patterned to form, for example, a gate for a transfer transistor. Additionally, a floating diffusion region and p+ pinning layer may be formed, as shown in FIG. 8. Also at step 150, an additional n-well may be formed. However, this step is optional and only one n-well may be formed if desired.

At step 310, a wafer handler may be attached to substrate 130. The substrate may be flipped with the wafer handler and then thinned to a desired thickness at step 310. At step 312, a trench may be formed in the substrate, as shown in FIG. 11. The trench may be formed with an etching process. After forming the trench, n-type doped epitaxial silicon may be grown in the trench at step 314. The n-type doped epitaxial silicon may be doped with the same dopant as one or both of the n-wells. The n-type doped epitaxial silicon and the n-wells may combine to form the photodiode of the pixel. After growing the epitaxial layer, the epitaxial layer may be laser annealed at step 316. After laser annealing, chemical mechanical planarization may be completed at step 318 to ensure the epitaxial layer has a planar and smooth surface. At step 320, the wafer may be flipped and the wafer may undergo back end of line processing to form a dielectric stack with metal interconnect routing paths (e.g., FIG. 9). Finally, at step 322 the wafer may be flipped again and a color filter and microlens may be formed over the epitaxial layer.

Figure 16:
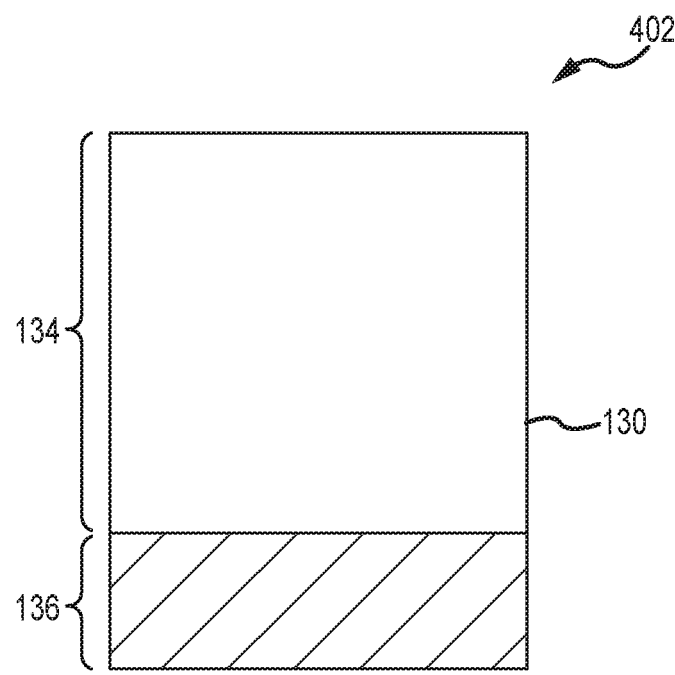
FIG. 16 is a cross-sectional side view of an illustrative graded substrate in accordance with an embodiment of the present invention.

To form a deep photodiode that may be used in near infrared light applications, a substrate may be provided such as substrate 130 at step 402 as shown in FIG. 16. Substrate 130 may be a silicon substrate. Substrate 130 may, for example, be a doped substrate such as a p-type substrate or an n-type substrate. Substrate 130 may be a layer of epitaxial silicon such as a p-type or n-type epitaxial layer. Substrate 130 may sometimes be referred to as a wafer.

In certain embodiments, substrate 130 may be a graded substrate provided with different doping concentrations. For example, region 134 may have a first doping concentration, and region 136 may have a second doping concentration. Region 136 may have a higher doping concentration than region 134. Regions 134 and 136 may be doped with boron. Region 134 may have a concentration of boron between $10^{16}$ cm$^{-3}$ and $10^{17}$ cm$^{-3}$. In certain embodiments, region 134 may have a concentration of boron of $5\times10^{16}$ cm$^{-3}$. Region 136 may have a concentration of boron between $10^{18}$ cm$^{-3}$ and $10^{19}$ cm$^{-3}$. In certain embodiments, region 136 may have a concentration of boron of $3\times10^{18}$ cm$^{-3}$. These concentrations are merely illustrative and any desired doping concentrations may be used. The example of boron being used as a dopant is also illustrative, and any desired dopant may be used. Regions 134 and 136 may have any desired thicknesses. In certain embodiments, region 134 may have a thickness of about 5.0 μm, about 5.5 μm, or between 4.5 μm and 6.0 μm. Region 136 may have a thickness of about 1.0 μm. Other thicknesses may be used if desired.

Figure 17:
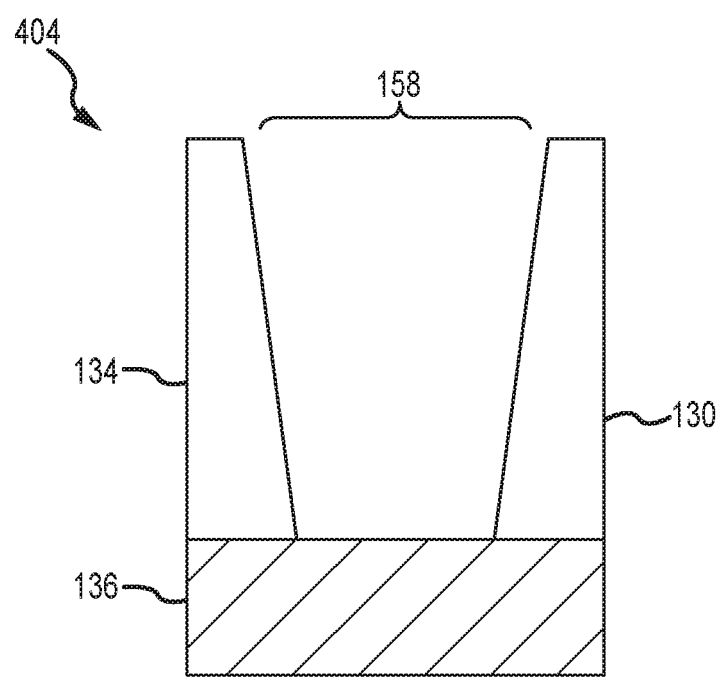
FIG. 17 is a cross-sectional side view of the substrate of FIG. 16 after a trench has been formed in the substrate in accordance with an embodiment of the present invention.

At step 404 of FIG. 17, a trench may be formed. The trench may be formed via an etching process such as dry etching or wet etching. In wet etching, region 134 of substrate 130 may be immersed in a bath of etchant. The etchant may be buffered hydrofluoric acid, potassium hydroxide, a solution of ethylene diamine and pyrocatechol, or any other suitable etchant. A hard mask may be provided that is resistant to the etchant. Accordingly, the hard mask may prevent substrate 130 from being etched in the areas directly beneath the hard mask. In the areas not covered by the hard mask, the silicon etching may form trenches such as trench 158. The dimensions of trench 158 can be controlled during the etching process. For example, immersing substrate 130 in a bath of etchant for a longer period of time may result in a deeper trench. As previously discussed, region 134 and region 136 of the substrate may have different doping concentrations. This change in concentration may serve as an etch stop and enable precise control of the depth of trench 158.

Figure 18:
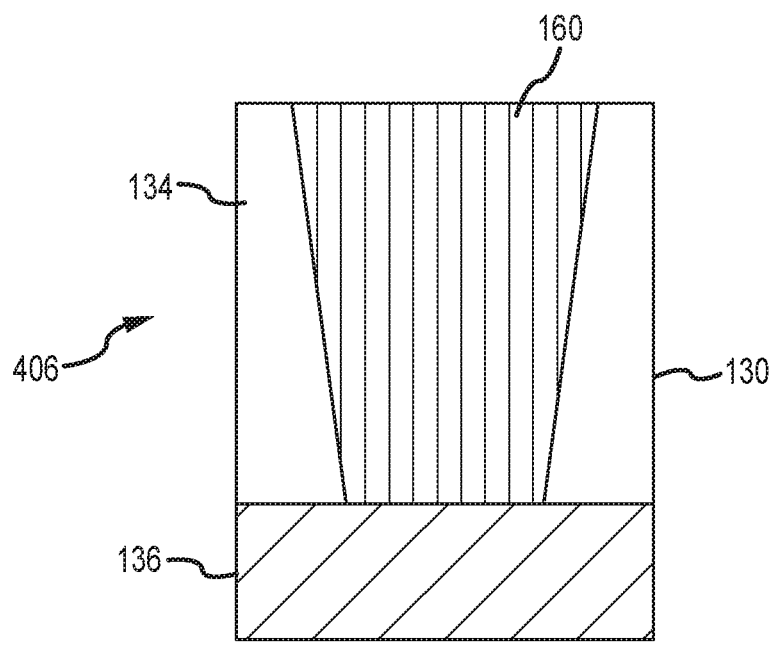
FIG. 18 is a cross-sectional side view of the pixel of FIG. 17 after doped epitaxial silicon has been grown in the trench in accordance with an embodiment of the present invention.

At step 406 of FIG. 18, n-type epitaxial silicon 160 may be grown to fill trench 158. Epitaxial silicon 160 may be doped with the arsenic or phosphorus, as examples. If desired, doping of epitaxial silicon 160 may be done in situ such that the doping occurs while the epitaxial layer is being grown.

Epitaxial layer 160 may be formed using a variety of growth methods. For example, epitaxial layer 160 may be formed using vapor-phase epitaxy, liquid-phase epitaxy, or solid-phase epitaxy. Epitaxial layer 160 may be formed via growth at any suitable temperature. Epitaxial layer may be formed via growth at temperatures of about 500° C., about 550° C., about 650° C., between 500° C. and 550° C., between 450° C. and 600° C., less than 650° C., more than 650° C., 1200° C., more than 1200° C., or any other suitable temperature. After epitaxial layer 160 is formed, laser annealing may be performed to activate the dopants. Chemical mechanical planarization may also be performed to ensure that epitaxial layer 160 has a smooth and planar surface.

Figure 19:
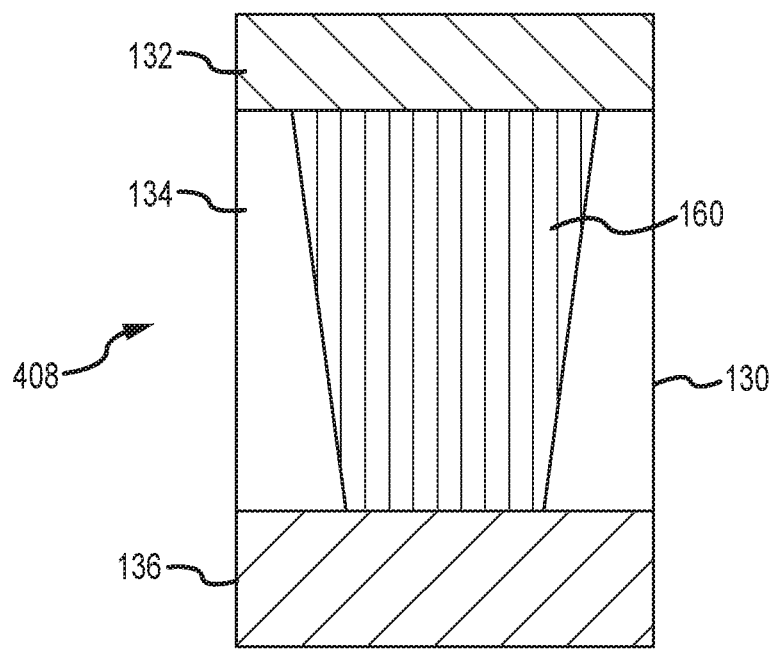
FIG. 19 is a cross-sectional side view of the pixel of FIG. 18 showing how additional epitaxial silicon may optionally be grown in accordance with an embodiment of the present invention.

After growing epitaxial layer 160, epitaxial layer 132 may be grown at step 408 as shown in FIG. 19. Epitaxial layer 132 may be a p-type doped epitaxial layer. Epitaxial layer 132 may have a smaller doping concentration than regions 134 and 136 of substrate 130. Forming epitaxial layer 132 is optional and in certain embodiments no additional p-type epitaxial layer may be formed.

Figure 20:
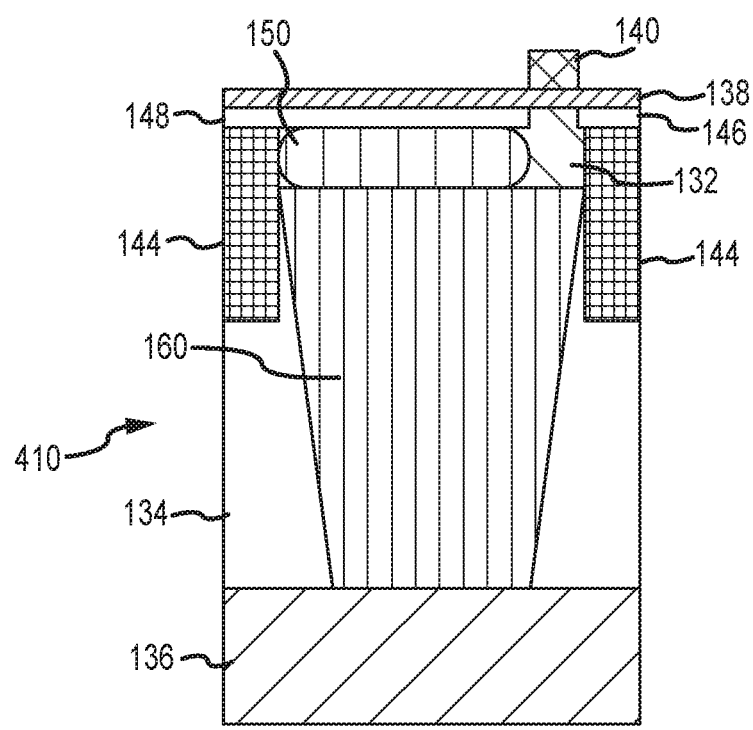
FIG. 20 is a cross-sectional side view of the pixel of FIG. 19 with gate oxide, patterned gate polysilicon, an n-well, and isolation regions in accordance with an embodiment of the present invention.

At step 410 of FIG. 20, substrate 130 may be provided with gate oxide 138 and gate polysilicon 140. Gate oxide 138 and gate polysilicon 140 may be formed on substrate 130 using any desired methods. Gate polysilicon 140 may be patterned using any desired methods. Gate polysilicon 140 may be used as a transfer gate in the pixel. An additional region 146 may be formed. Region 146 may be a floating diffusion region. Floating diffusion region 146 may be an n-well if desired. Gate polysilicon 140 may act as a transfer gate that transfers charge to floating diffusion region 146. At step 410, substrate 130 may be provided with p-well isolation. Isolation regions 144 may be formed by implanting p-type dopant into substrate 130. Isolation regions 144 may be formed with boron, as an example. P+ pinning layer 148 may also be formed at step 410.

At step 410 of FIG. 20, n-well 150 may be formed. N-well 150 may be formed with phosphorus or arsenic dopants, as examples. In certain embodiments, n-well 150 may be doped with the same dopant as epitaxial layer 160. For example, both n-well 150 and epitaxial layer 160 may be doped with phosphorus, or both n-well 150 and epitaxial layer 160 may be doped with arsenic. In other embodiments, n-well 150 and epitaxial layer 160 may be doped with different dopants. For example, n-well 150 may be doped with arsenic while epitaxial layer 160 may be doped with phosphorus. Alternatively, n-well 150 may be doped with phosphorus while epitaxial layer 160 may be doped with arsenic. In certain embodiments, the additional n-well 150 may be omitted and epitaxial layer 160 may be the only n-type silicon that forms the photodiode.

Figure 21:
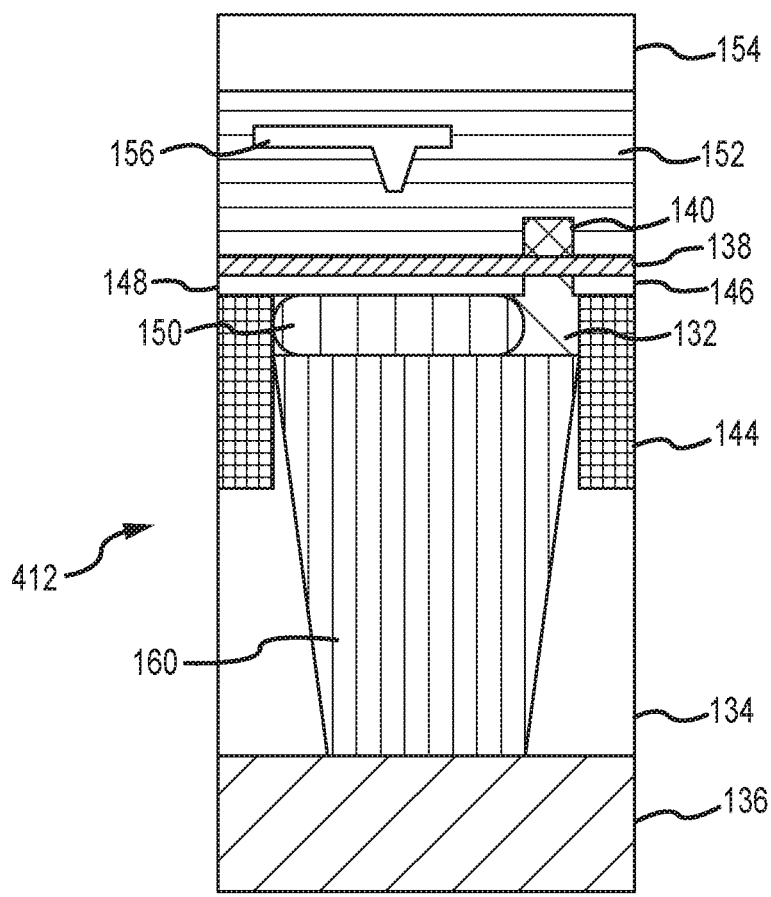
FIG. 21 is a cross-sectional side view of the pixel of FIG. 20 after back end of line processing has occurred and a wafer handler has been attached in accordance with an embodiment of the present invention.

At step 412 of FIG. 21, back end of line (BEOL) processing may occur, resulting in a dielectric stack 152 with metal interconnect routing paths 156. Additionally at step 412, wafer handler 154 may be attached to the dielectric stack. Wafer handler 154 may be used to move, control, and flip substrate 130 when necessary. In subsequent processes, a filter element and microlens may be formed above the photodiode.

Figure 22:
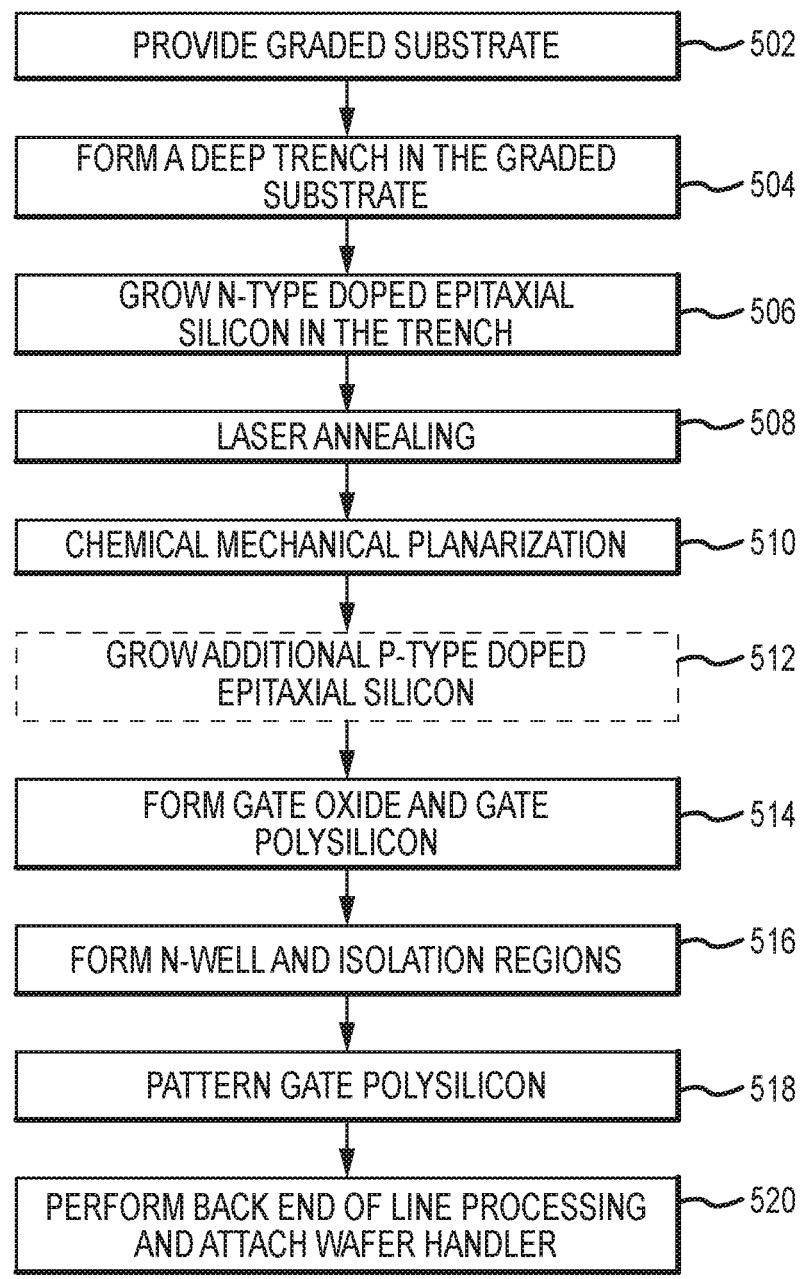
FIG. 22 is a list of illustrative steps showing how doped epitaxial silicon may be grown to form a photodiode for a pixel in accordance with an embodiment of the present invention.

FIG. 22 shows illustrative steps for forming a photodiode using n-type doped epitaxial silicon. At step 502, a substrate may be provided, as shown in FIG. 5. The substrate may be a graded substrate. At step 504, a trench may be formed in the substrate, as shown in FIG. 17. The trench may be formed with an etching process. After forming the trench, n-type doped epitaxial silicon may be grown in the trench at step 506. After growing the epitaxial layer, the epitaxial layer may be laser annealed at step 508. After laser annealing, chemical mechanical planarization may be completed at step 510 to ensure the epitaxial layer has a planar and smooth surface.

Additional p-type doped epitaxial silicon may optionally be grown on the n-type doped epitaxial layer at step 512. At step 514, gate oxide and gate polysilicon may be formed on the wafer. At step 516, an n-well and isolation regions may be formed using ion implantation, as shown in FIG. 20. The n-well may be formed by implanting arsenic or phosphorus ions, while the isolation regions may be formed by implanting boron ions. In embodiments where step 512 is completed, the n-well may be formed in the p-type doped epitaxial layer. In embodiments where step 512 is not completed, the n-well may be formed in the n-type doped epitaxial layer. At step 518, the gate polysilicon may be patterned to form, for example, a gate for a transfer transistor. Additionally, a floating diffusion region and p+ pinning layer may be formed, as shown in FIG. 20. At step 520, the wafer may undergo back end of line processing to form a dielectric stack with metal interconnect routing paths (e.g., FIG. 21). A wafer handler may also be attached to substrate 130 at this time.

The foregoing descriptions describe a scenario where a p-type doped substrate is used. Any or all of a first n-well, a second n-well, n-type doped epitaxial silicon, and p-type isolation regions may be formed in the p-type doped substrate. It should be understand that the specific doping types used in these examples are merely illustrative, and the doping type of each component may be switched if desired. For example, a first p-well, a second p-well, p-type doped epitaxial silicon, and n-type isolation regions may be formed in an n-type doped substrate.

Various embodiments have been described illustrating a method of forming a pixel. The method may include forming a trench in a substrate, growing doped epitaxial silicon in the trench, forming an n-well region that overlaps the doped epitaxial silicon, and forming first and second isolation regions. The n-well region and the doped epitaxial silicon may be interposed between the first and second isolation regions. Forming the trench in the substrate may include etching the substrate to form the trench. The substrate may include a p-type doped substrate. The p-type doped substrate may be a graded substrate with a first region and a second region. The first region may have a first p-type doping concentration, while the second region may have a second p-type doping concentration that is different than the first p-type doping concentration.

Growing the doped epitaxial silicon in the trench may include growing n-type doped epitaxial silicon in the trench. Forming the first and second isolation regions may include implanting a p-type dopant into the substrate. The method may also include growing p-type doped epitaxial silicon on the n-type doped epitaxial silicon after growing the n-type doped epitaxial silicon in the trench. Forming the n-well region may include implanting an n-type dopant in the p-type doped epitaxial silicon.

The method may also include laser annealing the doped epitaxial silicon after growing the doped epitaxial silicon in the trench and performing chemical mechanical planarization on the doped epitaxial silicon after laser annealing the doped epitaxial silicon. Growing the doped epitaxial silicon in the trench may include growing the doped epitaxial silicon at temperatures between 450° C. and 600° C. The method may also include performing back end of line processing to form a dielectric stack and metal interconnect routing paths.

In various embodiments, a method of forming a pixel may include forming a gate oxide layer and a gate polysilicon layer on a substrate, forming a first n-well in the substrate, forming first and second isolation regions in the substrate such that the first n-well is interposed between the first and second isolation regions, forming a dielectric stack and metal interconnect routing paths over the gate polysilicon layer, thinning the substrate to a desired thickness after forming the dielectric stack and the metal interconnect routing paths over the gate polysilicon layer, forming a trench above the first n-well after thinning the substrate to the desired thickness, and growing n-type doped epitaxial silicon in the trench. Forming the first n-well in the substrate may include implanting phosphorus into the substrate. The method may also include forming a second n-well in the substrate before forming the dielectric stack and the metal interconnect routing paths over the gate polysilicon layer. Forming the second n-well in the substrate may include implanting arsenic into the substrate. The n-type doped epitaxial silicon may be doped with a dopant selected from the group consisting of: phosphorus and arsenic. The method may also include laser annealing the n-type doped epitaxial silicon in the trench after growing the n-type doped epitaxial silicon in the trench, and performing chemical mechanical planarization on the n-type doped epitaxial silicon after laser annealing the n-type doped epitaxial silicon in the trench.

In various embodiments, an image sensor may include a plurality of pixels. Each pixel may include a p-type doped substrate, n-type doped epitaxial silicon formed in substrate, isolation regions that surround the n-type doped epitaxial silicon, a filter element formed over the n-type doped epitaxial silicon, and a microlens formed over each n-type doped epitaxial silicon. The isolation regions may include p-type doped isolation regions.

The foregoing is merely illustrative of the principles of this invention and various modifications can be made by those skilled in the art without departing from the scope and spirit of the invention.

What is claimed is:

1. A method of forming a pixel comprising:
   forming a trench in a substrate, wherein the substrate comprises a p-type doped substrate;
   growing n-type doped epitaxial silicon in the trench;
   after growing the n-type doped epitaxial silicon in the trench, growing p-type doped epitaxial silicon on the n-type doped epitaxial silicon;
   forming an n-well region that overlaps the n-type doped epitaxial silicon, wherein forming the n-well region comprises implanting an n-type dopant in the p-type doped epitaxial silicon; and
   forming first and second isolation regions, wherein the n-well region and the n-type doped epitaxial silicon are interposed between the first and second isolation regions.

2. The method defined in claim 1, wherein forming the trench in the substrate comprises etching the substrate to form the trench.

3. The method defined in claim 1, wherein the p-type doped substrate is a graded substrate with a first region and a second region, wherein the first region has a first p-type doping concentration, and wherein the second region has a second p-type doping concentration that is different than the first p-type doping concentration.

4. The method defined in claim 1, wherein forming the first and second isolation regions comprises implanting a p-type dopant into the substrate.

5. The method defined in claim 1, further comprising:
after growing the n-type doped epitaxial silicon in the trench, laser annealing the n-type doped epitaxial silicon.

6. The method defined in claim 5, further comprising:
after laser annealing the n-type doped epitaxial silicon, performing chemical mechanical planarization on the n-type doped epitaxial silicon.

7. The method defined in claim 1, wherein growing the n-type doped epitaxial silicon in the trench comprises growing the n-type doped epitaxial silicon at temperatures between 450° C. and 600° C.

8. The method defined in claim 1, further comprising:
performing back end of line processing to form a dielectric stack and metal interconnect routing paths.

9. A method of forming a pixel comprising:
forming a gate oxide layer and a gate polysilicon layer on a substrate;
forming a first n-well in the substrate;
forming first and second isolation regions in the substrate, wherein the first n-well is interposed between the first and second isolation regions;
forming a dielectric stack and metal interconnect routing paths over the gate polysilicon layer;
after forming the dielectric stack and the metal interconnect routing paths over the gate polysilicon layer, thinning the substrate to a thickness;
after thinning the substrate to the thickness, forming a trench above the first n-well; and
growing n-type doped epitaxial silicon in the trench.

10. The method defined in claim 9, wherein forming the first n-well in the substrate comprises implanting phosphorus into the substrate.

11. The method defined in claim 10, further comprising:
before forming the dielectric stack and the metal interconnect routing paths over the gate polysilicon layer, forming a second n-well in the substrate.

12. The method defined in claim 11, wherein forming the second n-well in the substrate comprises implanting arsenic into the substrate.

13. The method defined in claim 12, wherein the n-type doped epitaxial silicon is doped with a dopant selected from the group consisting of: phosphorus and arsenic.

14. The method defined in claim 9, further comprising:
after growing the n-type doped epitaxial silicon in the trench, laser annealing the n-type doped epitaxial silicon in the trench; and
after laser annealing the n-type doped epitaxial silicon in the trench, performing chemical mechanical planarization on the n-type doped epitaxial silicon.

* * * * *